US006560122B2

(12) United States Patent
Weber (10) Patent No.: US 6,560,122 B2
(45) Date of Patent: May 6, 2003

(54) CHIP PACKAGE WITH MOLDED UNDERFILL

(75) Inventor: Patrick O. Weber, Mountain View, CA (US)

(73) Assignee: Hestia Technologies, Inc., Santa Clara, CA (US)

( * ) Notice: Subject to any disclaimer, the term of this patent is extended or adjusted under 35 U.S.C. 154(b) by 0 days.

(21) Appl. No.: 09/967,676

(22) Filed: Sep. 28, 2001

(65) Prior Publication Data

US 2002/0043721 A1 Apr. 18, 2002

Related U.S. Application Data

(63) Continuation of application No. 09/459,602, filed on Dec. 13, 1999, now Pat. No. 6,324,069, which is a continuation-in-part of application No. 08/959,927, filed on Oct. 29, 1997, now Pat. No. 6,038,136.

(51) Int. Cl.[7] .......................... H01L 23/31; H01L 23/29
(52) U.S. Cl. ...................... 361/783; 361/760; 361/770; 257/667; 257/737; 257/738; 257/778; 257/787; 257/789; 174/260
(58) Field of Search .......................... 361/748, 760, 361/767, 768, 770, 783; 257/667, 737, 738, 778, 787–789, 795; 174/260, 262, 266; 438/108, 124, 126, 127; 29/841, 852, 855, 856; 228/180.22; 264/272.17

(56) References Cited

U.S. PATENT DOCUMENTS

| 4,143,456 A | 3/1979 | Inoue |
| 4,545,610 A | 10/1985 | Lakritz et al. |
| 4,573,105 A | 2/1986 | Beldavs |
| 4,644,445 A | 2/1987 | Sakuma |
| 4,770,899 A | 9/1988 | Zeller |
| 4,859,722 A | 8/1989 | Shiobara |
| 5,120,678 A | 6/1992 | Moore et al. |
| 5,186,383 A | 2/1993 | Melton et al. |
| 5,200,366 A | 4/1993 | Yamada et al. |
| 5,203,076 A | 4/1993 | Banerji et al. |
| 5,210,938 A | 5/1993 | Hirai |
| 5,218,234 A | 6/1993 | Thompson et al. |

(List continued on next page.)

FOREIGN PATENT DOCUMENTS

| JP | 01-191457 A | 8/1989 |
| JP | 06-204272 A | 7/1994 |

OTHER PUBLICATIONS

IBM Technical Disclosure Bulletin, "Access Entry Port", vol. 38, No. 12, Dec. 1995, pp 131 and 132.
Moore, Kevin, et al. "Solder Joint Reliability of Fine Pitch Solder Bumped Pad Array Carriers", Motorola, Inc. pp. 264–274.

Primary Examiner—David L. Talbott
Assistant Examiner—John B. Vigushin
(74) Attorney, Agent, or Firm—Burns, Doane, Swecker & Mathis, LLP (57) ABSTRACT

An integrated circuit chip package according to the present invention includes an integrated circuit chip that is mounted on a substrate by a reflow process and by a plurality of solder bumps. At least one standoff is located between the circuit chip and the substrate to maintain a distance between the circuit chip and the substrate during the reflow process. A mold compound is used for underfilling air gaps between the chip and the substrate. The integrated circuit chip package is formed by placing the chip and substrate within a mold cavity and pressing a transfer mold compound into the mold cavity. Air spaces between the integrated circuit chip and the substrate are underfilled by the mold compound as it is pressed in between the integrated circuit chip, the standoffs and the substrate. Air is allowed to escape from between the chip and the substrate during the underfilling through a vent which extends through the substrate. The underfilling material may also be used to encapsulate the chip at the same time that underfilling is performed.

13 Claims, 8 Drawing Sheets

U.S. PATENT DOCUMENTS

| | | |
|---|---|---|
| 5,249,101 A | 9/1993 | Frey et al. |
| 5,266,748 A | 11/1993 | Kawakami et al. |
| 5,269,453 A | 12/1993 | Melton et al. |
| 5,296,738 A | 3/1994 | Freyman et al. |
| 5,323,947 A | 6/1994 | Juskey et al. |
| 5,355,283 A | 10/1994 | Marrs et al. |
| 5,371,404 A | 12/1994 | Juskey et al. |
| 5,380,560 A | 1/1995 | Kaja et al. |
| 5,385,869 A | 1/1995 | Liu et al. |
| 5,400,950 A | 3/1995 | Myers et al. |
| 5,408,121 A | 4/1995 | Nakamura et al. |
| 5,439,162 A | 8/1995 | George et al. |
| 5,461,922 A | 10/1995 | Koen |
| 5,468,995 A | 11/1995 | Higgins |
| 5,535,101 A | 7/1996 | Miles et al. |
| 5,557,150 A | 9/1996 | Variot et al. |
| 5,565,709 A | 10/1996 | Fukushima et al. |
| 5,581,122 A | 12/1996 | Chao et al. |
| 5,590,462 A | 1/1997 | Hundt et al. |
| 5,612,576 A | 3/1997 | Wilson et al. |
| 5,619,070 A | 4/1997 | Kozono |
| 5,633,535 A | 5/1997 | Chao et al. |
| 5,641,996 A | 6/1997 | Oyomya |
| 5,697,148 A * | 12/1997 | Lance, Jr. et al. .......... 438/126 |
| 5,700,715 A | 12/1997 | Pasch |
| 5,700,723 A | 12/1997 | Barber |
| 5,704,116 A | 1/1998 | Gamota et al. |
| 5,708,304 A | 1/1998 | Tomita |
| 5,710,071 A | 1/1998 | Beddingfield et al. |
| 5,731,231 A | 3/1998 | Miyajima |
| 5,736,789 A | 4/1998 | Moscicki |
| 5,767,446 A | 6/1998 | Ha et al. |
| 5,814,882 A | 9/1998 | Shimada et al. |
| 5,827,999 A | 10/1998 | McMillan et al. |
| 5,841,192 A | 11/1998 | Exposito |
| 5,880,017 A | 3/1999 | Schwiebert et al. |
| 5,892,290 A | 4/1999 | Chakravorty et al. |
| 5,981,312 A | 11/1999 | Farquhar et al. |
| 6,000,924 A | 12/1999 | Wang et al. |
| 6,027,590 A | 2/2000 | Sylvester et al. |
| 6,054,755 A | 4/2000 | Takamichi et al. |
| 6,057,597 A | 5/2000 | Farnworth et al. |
| 6,074,897 A | 6/2000 | Degani et al. |
| 6,081,997 A | 7/2000 | Chia et al. |
| 6,107,689 A | 8/2000 | Kozono |
| 6,121,689 A | 9/2000 | Capote et al. |
| 6,333,206 B1 * | 12/2001 | Ito et al. ..................... 257/789 |

\* cited by examiner

CHIP PACKAGE WITH MOLDED UNDERFILL

RELATED APPLICATION

This application is a continuation of U.S. application Ser. No. 09/459,602 filed Dec. 13, 1999, now U.S. Pat. No. 6,324,069 B1 which is a continuation-in-part of application Ser. No. 08/959,927 filed Oct. 29, 1997 now U.S. Pat. No. 6,038,136.

FIELD OF INVENTION

The invention relates to chip packages and a method used for manufacturing chip packages and, more particularly, to an integrated circuit chip package mounting system and a method of electrically connecting and mounting integrated circuit chips to a substrate.

BACKGROUND OF THE INVENTION

Flip chip technology is well known in the art for electrically connecting an integrated circuit chip to an integrated circuit substrate or package. Formation of one type of flip chip involves forming solder bumps on electrical interconnection pads on the active or front side of a semiconductor chip. The chip with solder bumps is prepared with a flux material and then is inverted onto a laminate substrate with the solder bumps aligned with metal circuits provided on the substrate. The flux cleans and activates the solder bumps for melting or reflowing. The solder bumps on the chip are then soldered to the metal pads on the substrate by melting the solder in a reflow furnace. A solder joint is formed by the reflowing of the solder between the semiconductor chip and the substrate. After the chip has been attached to the substrate by the reflow soldering process, narrow gaps are present between the solder bumps and between the chip and substrate. The gap between the chip and the substrate is determined by the height of the solder bumps, the flux preparation process, and the reflow process. Solder bumps have a tendency to reflow too much, resulting in a very narrow gap between the chip and the substrate. The current reflow process includes the use of a solder resist mask that covers the substrate surface to be mated with the solder bumps. An etching process removes the areas of the solder resist mask where the solder bumps are to reflow onto the circuit traces. If the gap between the chip and the substrate is too narrow, then the underfill process can be negatively affected since the capillary action is dependent on the size of the gap. Moreover, the underfill material may adhere to the solder resist mask which would further impede the capillary action of the underfill material during the underfilling process.

The substrate is typically comprised of a ceramic material or a polymer composite laminate while the chip is formed of silicon. For example, when the substrate is comprised of a polymer composite laminate and the semiconductor chip is formed of silicon, there is a mismatch in the coefficient of thermal expansion between the semiconductor chip and the substrate on which the chip is mounted. During temperature cycling, the semiconductor chip and substrate expand and contract at differing rates. Accordingly, the soldered joints between the semiconductor chip and the substrate will have a tendency to fail because of the coefficient of thermal expansion mismatch. In addition, because of the very small size of the solder joints, the joints are subject to failures.

The strength of the solder joints between the integrated circuit chip and the substrate are typically enhanced by underfilling the space between the semiconductor chip and the substrate and around the solder joints. The underfill material is typically a polymer adhesive which reduces stress on the solder joints. A filler material may be added with the underfill material to improve the mechanical and electrical properties of the underfill material.

The conventional method of underfilling includes dispensing the underfill material in a fillet or bead extending along two or more edges of the chip and allowing the underfill material to flow by capillary action under the chip to fill all the gaps between the semiconductor chip and the substrate. The solder bumps create a very narrow gap between the semiconductor chip and the substrate which is about 0.002–0.005 inches (0.051–0.127 mm). Therefore, the underfill material which is capable of flowing through these narrow gaps contains only a small amount of filler material because the filler material will prevent the underfill material from flowing easily into the gaps. This type of underfill material with a low amount of filler material has an extremely high mismatch of coefficient of thermal expansion with the semiconductor chip, the solder bumps, and the substrate. Accordingly, it would be desirable to use an underfill material having more filler and thus, less of a thermal expansion coefficient mismatch with the substrate and chip. It would also be desirable to have means to control the height of the gap between the chip and the substrate during and after the reflow of the solder bumps.

An additional benefit of using an underfill material having more filler is that the filler material reduces moisture absorption. Where the underfill material absorbs less moisture, delamination between the underfill material and the substrate surface and/or the semiconductor chip is less likely to occur. Further, liquid adhering to the underfill material may result in contamination problems.

Figure 1:
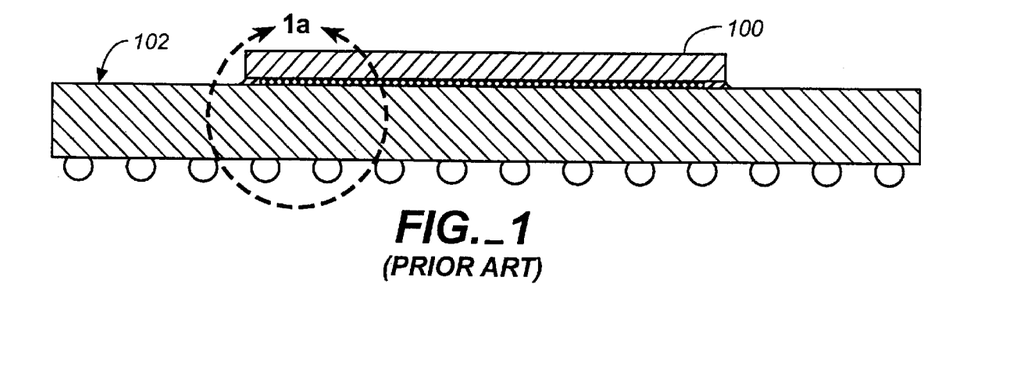
FIG. 1 is a side view of an integrated circuit chip mounted on a substrate and underfilled according to a prior art method.
Figure 1A:
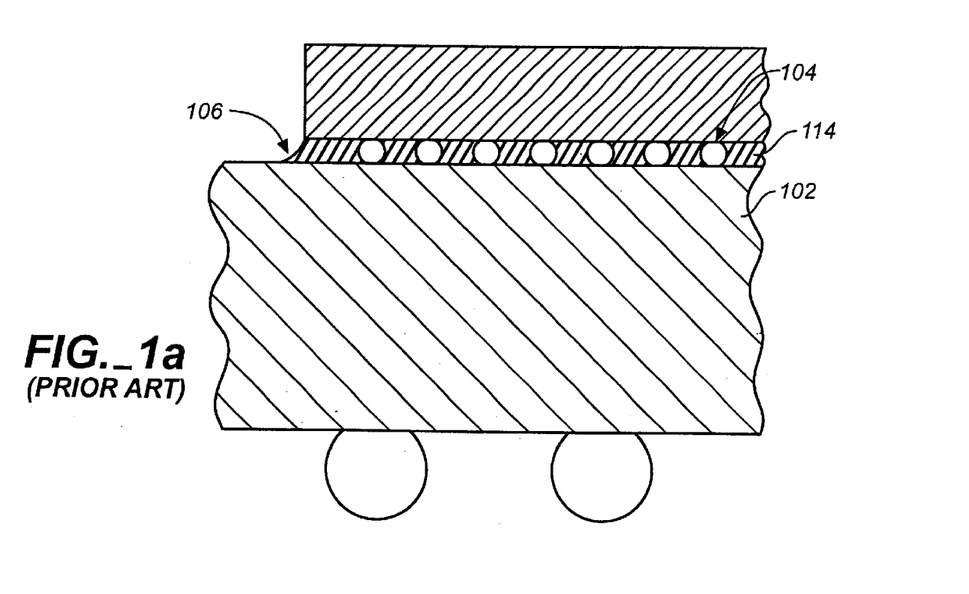
FIG. 1a is an enlarged side view of a portion of the integrated circuit chip and substrate of FIG. 1.
Figure 2:
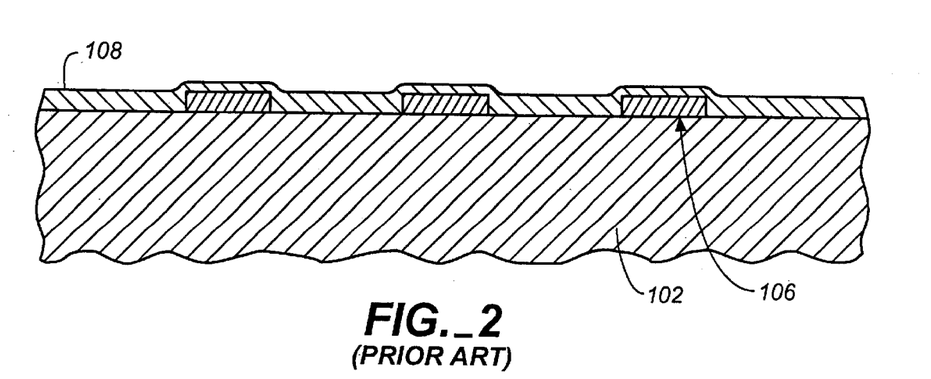
FIG. 2 is an enlarged side view of a portion of the substrate according to the prior art method.
Figure 3:
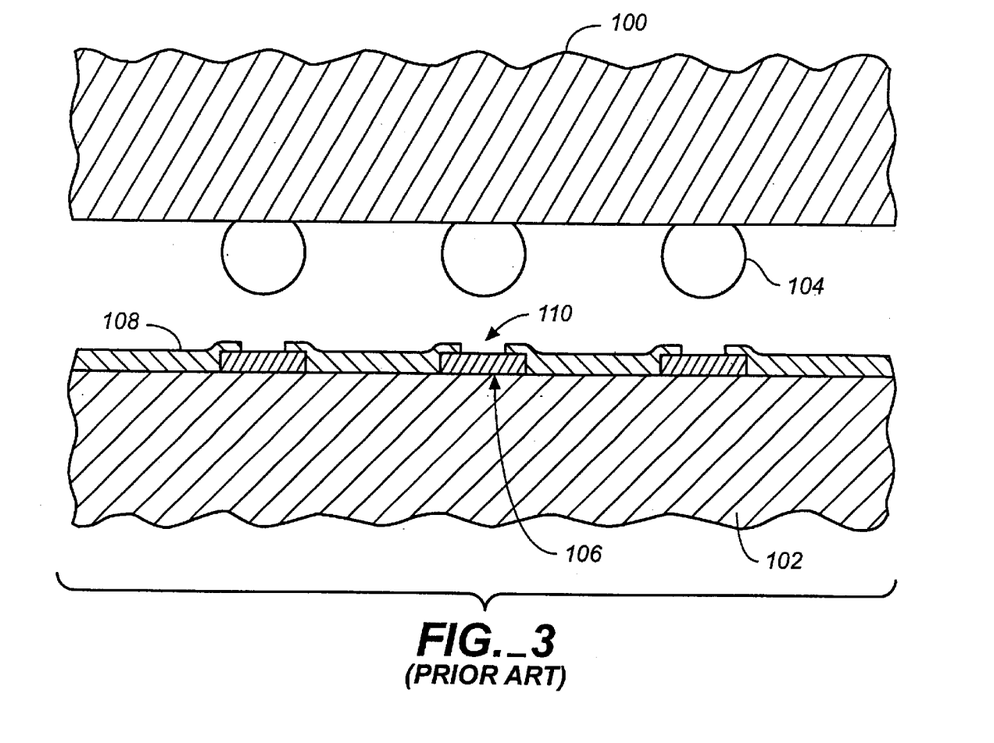
FIG. 3 is an enlarged side view of a portion of the chip and substrate prior to being bonded together according to the prior art method.
Figure 4:
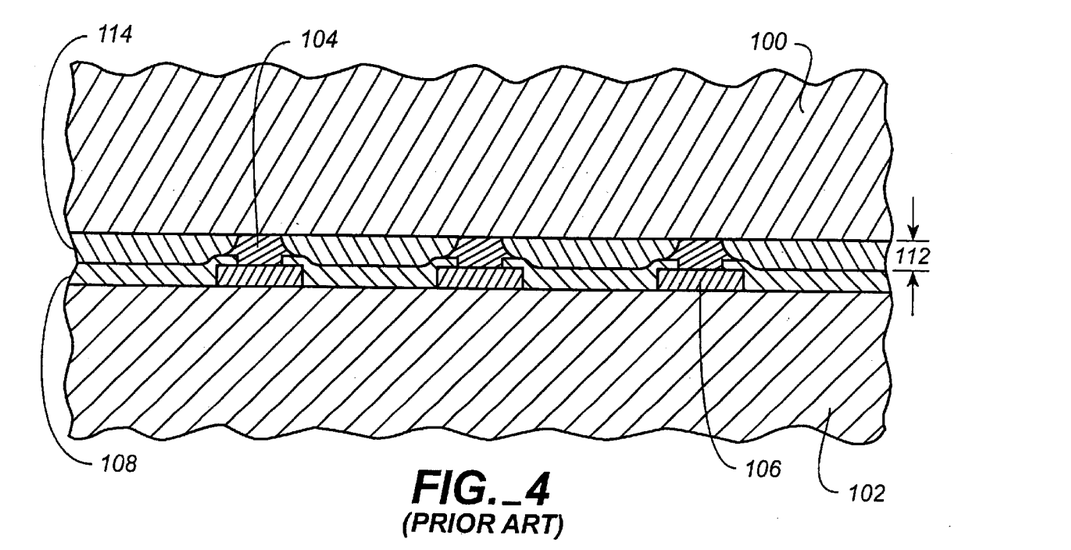
FIG. 4 is an enlarged side view of a portion of the chip and substrate after being bonded together according to the prior art method.

FIGS. 1 and 1a illustrate an example of an integrated circuit chip 100 which has been attached to a substrate 102 by solder bumps 104 and underfilled by a conventional method. The underfill material 114 has been drawn into the spaces between the solder bumps 104 by capillary action to fill the air spaces between the integrated circuit chip 100 and the substrate 102. FIG. 2 illustrates the substrate 102 with circuit traces 106 after the application of a liquid photoimagable solder mask 108, which is known in the art. FIG. 3 illustrates the chip package before the soldering reflow process with the chip 100 spaced from the substrate 102. The solder mask 108 has a series of openings 110 etched into the mask 108 to accept the solder bumps 104 during the reflow process. FIG. 4 illustrates the chip package after the reflow process and after the underfilling process. The solder bumps 104 reflow to make electrical contact with the circuit traces 106, and the resulting gap 112 is a function of the how much the solder bumps 104 melt and collapse during the reflow process. Then the gap is underfilled with underfill material 114. If the gap 112 becomes too narrow during the reflow process, it is difficult to completely underfill the area between the chip 100 and the substrate 102.

The use of capillary action to draw the underfill material into the gap between the integrated circuit chip and the substrate takes between 2 and 10 minutes, depending on many factors including the size of the chip, the size of the gap between the chip and the substrate, and the underfill material used. Another drawback of the conventional underfilling method is the occurrence of voids in the underfilling material, especially if the gap has become narrowed during the reflow process. Additionally, the conventional underfilling method does not allow for means to control the height of the gap between the chip and the substrate. Yet another drawback of the conventional underfilling method is that the underfill material does not bond well to the solder mask material.

Accordingly, a need exists for an underfilling method for completely filling the spaces between an integrated circuit chip and a substrate which can reliably underfill at a faster rate than known methods and wherein the height of the gap between the chip and the substrate after the reflow process is controlled. There also exists a need for an underfilling method that reduces or eliminates the use of the solder mask so that the underfill can bond directly to the substrate.

SUMMARY OF THE INVENTION

An integrated circuit chip package according to one aspect of the present invention includes an integrated circuit chip having an active surface with interconnection pads disposed thereon, and a substrate having a first surface with bonding pads substantially corresponding to the interconnection pads of the integrated circuit chip and a second side having a plurality of solder pads electrically interconnected with the bonding pads. A vent hole extends from the first side to the second side of the substrate and is positioned beneath the integrated circuit chip when the chip is mounted on the substrate. A plurality of solder bumps electrically connect the interconnection pads of the integrated circuit chip with the bonding pads on the first side of the substrate. A plurality of standoffs are located at the outer peripheral edges of the chip to control the height of the gap between the chip and the substrate after the soldering reflow process. A molded underfill material is molded around the integrated circuit chip. The molded underfill material surrounds the solder bumps between the integrated circuit chip and the substrate and extends into the vent hole in the substrate.

A further aspect of the present invention relates to controlling the height of the gap between the chip and the substrate during and after the reflow process through the use of a controlled application of flux material to the solder bumps. The substrate has a measured layer of flux on the first surface that is approximately half of the solder bump height. The measured layer of flux controls the amount of reflow that occurs and, therefore, controls the resulting gap between the chip and the substrate after the reflow process.

Yet a further aspect of the present invention relates to a method of underfilling an integrated circuit chip which has been electrically interconnected to a substrate. The method includes the steps of placing the integrated circuit chip and substrate within a mold cavity, injecting a mold compound into the mold cavity, underfilling a space between the integrated circuit chip and the substrate with the mold compound by the pressure of injection of the mold compound into the mold cavity, and allowing air to escape from between the integrated circuit chip and the substrate during underfilling through a vent in the substrate.

The present invention addresses the deficiencies of known reflowing and underfilling methods by controlling the gap between the chip and the substrate during the reflow process and by underfilling faster and more reliably than the known methods. In addition, the present invention forms an encapsulated integrated circuit chip package and performs underfilling in the same step.

BRIEF DESCRIPTION OF THE DRAWING FIGURES

The invention will be described in greater detail with reference to the accompanying drawings in which like elements bear like reference numerals, and wherein.

DETAILED DESCRIPTION OF THE PREFERRED EMBODIMENTS

Figure 7:
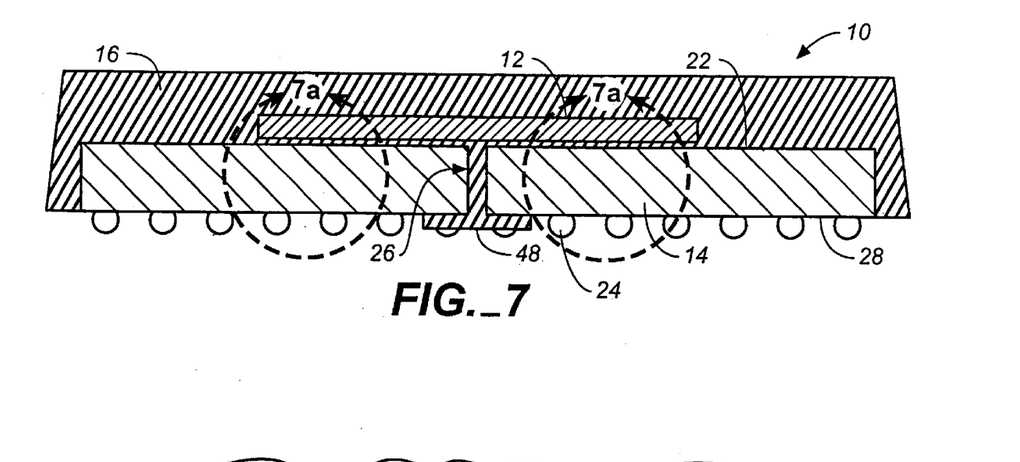
FIG. 7 is a cross-sectional side view of an integrated circuit chip mounted on a substrate, and the integrated circuit chip has been underfilled and encapsulated according to the present invention.

The integrated circuit chip package 10 according to the present invention is illustrated by way of example in FIG. 7 and includes an integrated circuit chip 12, a substrate 14, and a mold compound 16 encapsulating the chip and underfilling between the chip and the substrate. The integrated circuit chip package 10 is formed by transfer molding the package in a mold tool by a process which is described below with reference to FIGS. 12–15.

The integrated circuit chip package 10 according to the present invention can be made much faster than a similar package made using conventional underfilling techniques. In addition, the mold compound 16 used for underfilling also encapsulates the integrated circuit chip 12 in a single molding step. Further, as described below, the gap between the integrated circuit chip 12 and a substrate 14 is controlled by the use of a series of standoffs, which improves the disclosed underfilling method.

Figure 5:
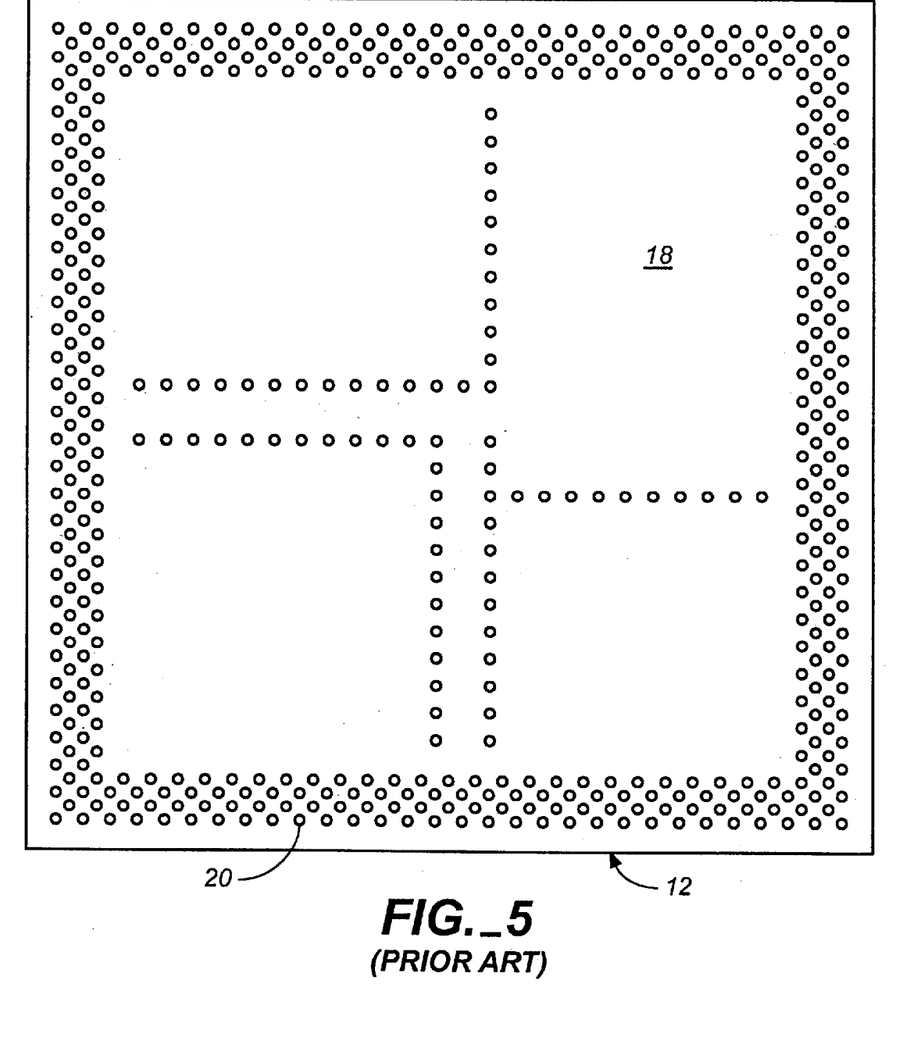
FIG. 5 is a top view of an integrated circuit chip with solder balls positioned on an active surface of the chip.
Figure 6:
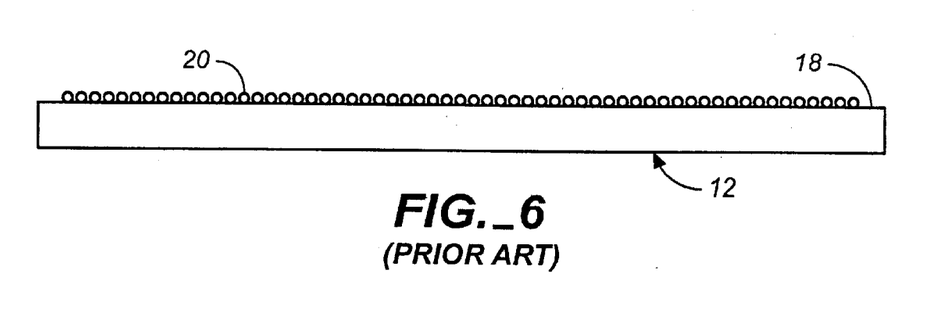
FIG. 6 is a side view of the integrated circuit chip of FIG. 5.

With reference to FIGS. 5 and 6, the integrated circuit chip 12 has an active upper surface 18 having metal circuits thereon. A plurality of solder bumps 20 are formed on the active surface 18 of the integrated circuit chip 12 for electrical interconnection of the chip to the substrate 14. The patterns of the solder bumps 20 on the integrated circuit chip 12 will vary widely between chips and may have spaces between the solder bumps which are as small as approximately 0.001 inches (0.025 mm). The solder bumps 20 themselves have a height which is approximately 0.005 inches (0.127 mm) and typically range from 0.004 inches to 0.005 inches.

Figure 7A:
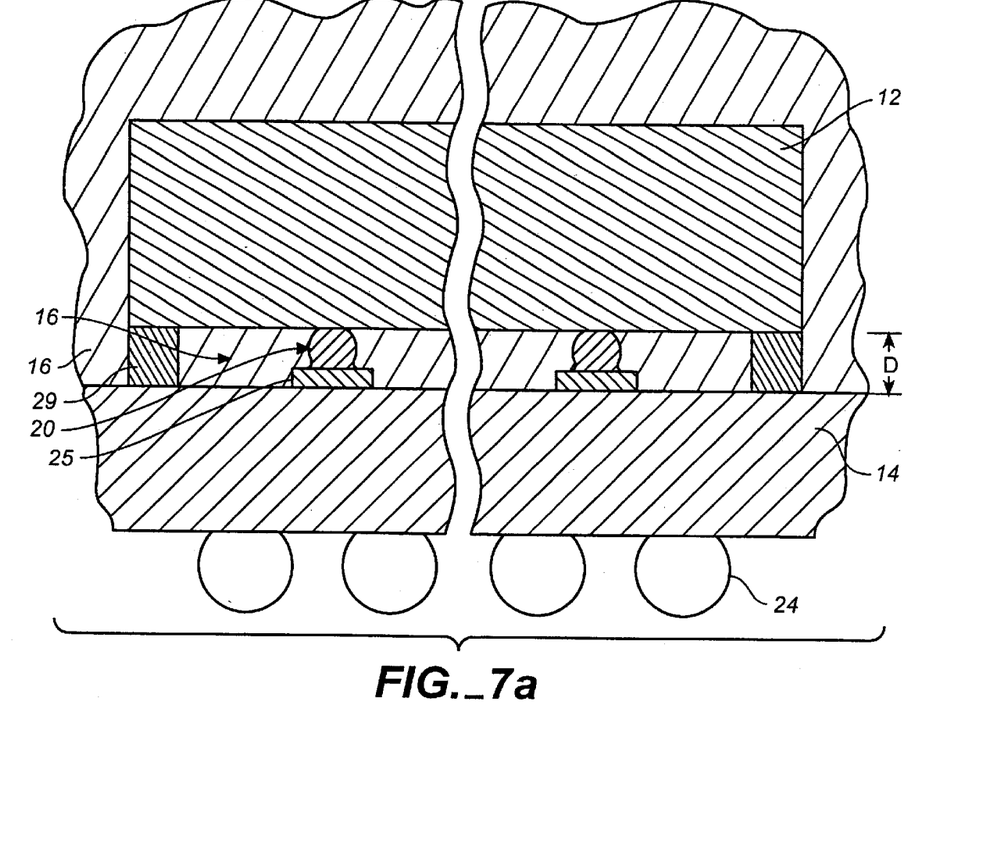
FIG. 7a is an enlarged cross-sectional side view of a portion of the integrated circuit chip of FIG. 7.

The substrate 14, as shown in FIGS. 7 and 7a, includes an upper surface 22 having bonding pads or circuit traces 25 which are located to substantially correspond to the locations of the interconnection pads and solder bumps 20 on the active surface 18 of the integrated circuit chip 12. A lower surface 28 of the substrate 14 also has a plurality of solder pads (not shown) which are electrically interconnected with the bonding pads on the top side of the substrate. The solder pads on the underside of the substrate are each provided with substrate solder bumps 24 which allow electrical interconnection between the integrated chip package 10 and a circuit board. The solder bumps 24 may be replaced by pins or the solder pads may be used alone without the solder bumps. According to the present invention the substrate 14 includes a vent hole 26 extending between the upper surface 22 and the lower surface 28 of the substrate and positioned at or near a center of the integrated circuit chip 12.

When the integrated circuit chip 12 is positioned on the substrate 14, the solder bumps 20 are melted by a reflow furnace to connect the integrated circuit chip to the substrate. The reflowed chip and substrate are separated by a distance D which is 0.001 inches (0.025 mm) to 0.006 inches (0.152 mm), preferably approximately 0.003 inches (0.076 mm) to 0.005 inches (0.127 mm).

According to the present invention, the underfilling material or mold material 16 is provided between the integrated circuit chip 12 and the substrate 14 and surrounding each of the solder bumps 20. The underfill material 16 is a thermoset mold compound which is forced into air gaps between the chip and the substrate by the pressure of the mold compound being forced into the mold tool. The forcing of the mold compound 16 under the chip 12 to provide underfilling provides substantial time savings over the conventional method of allowing the underfill material to be drawn under the chip by capillary action.

Figure 17:
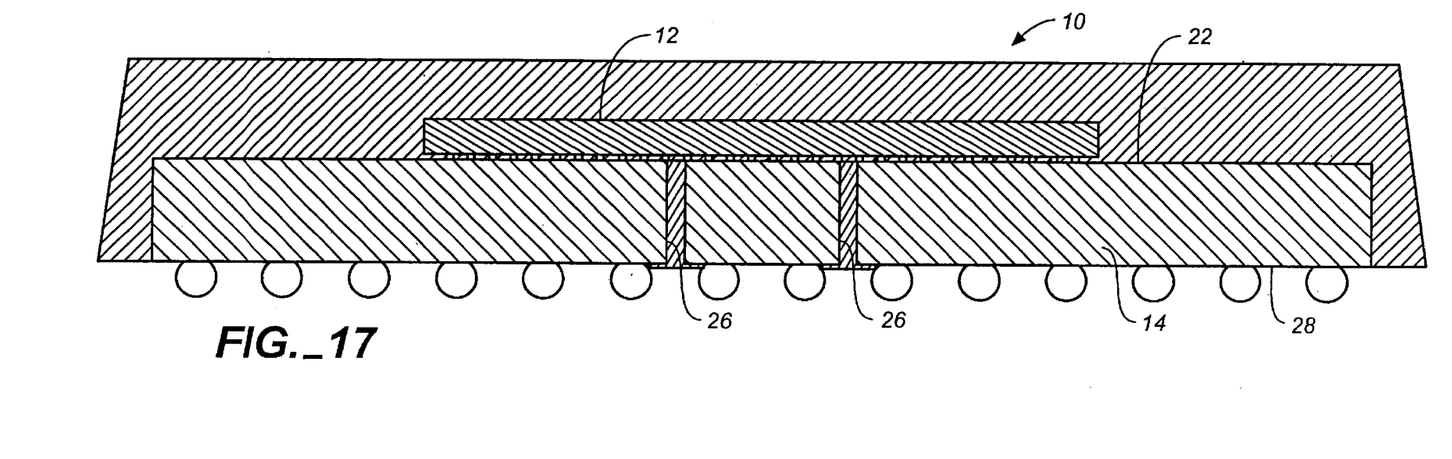
FIG. 17 is a cross-sectional side view of another embodiment of an integrated circuit chip package according to the present invention.

The vent hole 26 extending through the substrate 14 allows air to escape from between the integrated circuit chip 12 and the substrate 16 as the mold compound is forced underneath the chip and prevents air pockets from becoming trapped by the mold compound. The vent hole 26 is preferably positioned near a center point of a chip receiving area on the substrate upper surface 22. However, the locations of the solder bumps 20 may require that the vent hole 26 be located somewhat displaced from the center of the chip receiving area on the substrate. Alternatively, multiple vent holes may be used, as shown in FIG. 17. The vent hole 26 in the substrate 14 has a cross-sectional area which may vary depending on its location and the chip size and is typically between 0.004 inches (0.102 mm) to 0.030 inches (0.762 mm), and preferably between 0.006 inches (0.152 mm) and 0.012 inches (0.305 mm).

As stated above, the conventional method of underfilling utilizes capillary action to draw the underfill material between the integrated circuit chip and the substrate. As shown in FIG. 4, the prior art has a resultant gap 112 that is dependant upon the amount of reflow or melting of the solder bumps 104. If the gap is too narrow or too large after the reflow process, the underfilling process may not work because of gaps in the underfill material and because the necessary capillary action requires a certain gap size.

Figure 8:
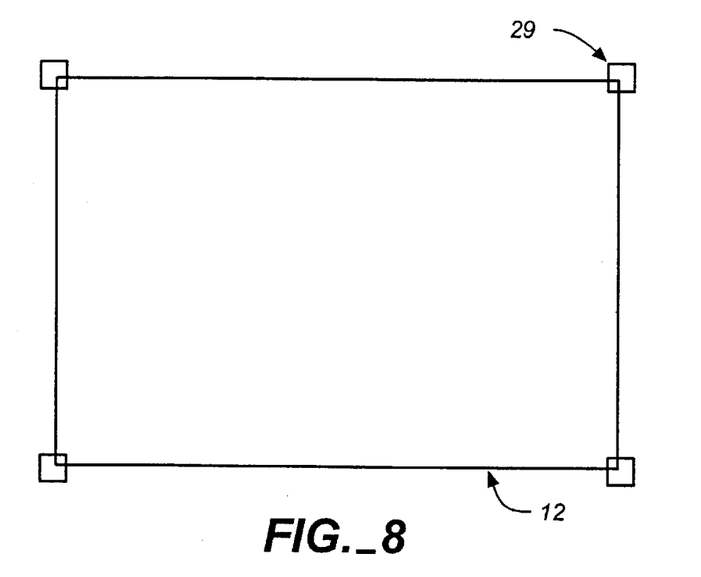
FIG. 8 is a top plan view of a portion of the integrated circuit chip and a plurality of standoffs.

According to the present invention, means to control the distance D or gap between the integrated circuit chip 12 and the substrate 14 is disclosed. Referring to FIGS. 7, 7a and 8, a plurality of standoffs 29 are positioned between the integrated circuit chip 12 and the substrate 14 at the peripheral edges. Preferably, for rectangular shaped integrated circuit chip 12, four standoffs 29 are located at each corner of the circuit chip. It should be noted, however, that the standoffs do not have to be located at the peripheral edge of the circuit chip 12. The standoffs could be arranged in a variety of ways with the only requirement that there is a passage for the underfill material to pass around the standoffs during the underfilling process. In addition, any number of standoffs could be utilized. For example, a tripod arrangement of three standoffs could be utilized. Or eight standoffs could be evenly spaced around the circuit chip 12. In the alternative, the standoff 29 could be a continuous piece around the periphery of the circuit chip 12 with apertures to allow the flow of the underfill material into solder bump area between the circuit chip 12 and the substrate 14. The standoffs 29 are made of liquid photo-imagable material (an epoxy and acrylic based material) and process, or LPI as known in the art. The LPI process is used to locate and register where the standoffs are to be located in relation to the substrate 14.

Prior to the reflow process, flux material is applied to the solder bumps or the substrate 14. An advantage of the use of standoffs 29 is that the flux material can be applied to the solder bumps by a screen printing process without concern for the application of too much flux. Another advantage of the use of standoffs 29 is that the underfill material adheres better to the substrate material 14 than the solder mask material of the prior art. Yet another advantage of the use of standoffs 29 is that the overall height of the package 10 is smaller since the solder mask material of the prior art has been eliminated.

Figure 9:
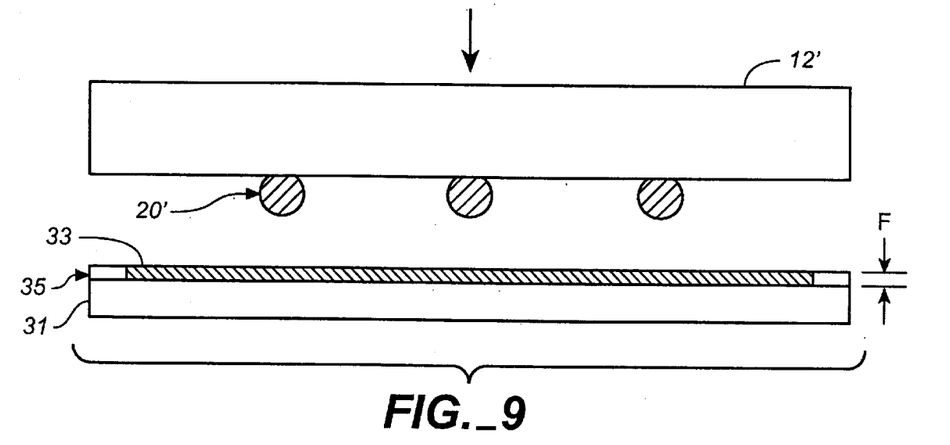
FIG. 9 is a cross-sectional side view of an alternative embodiment showing an integrated circuit chip with solder bumps prior to being dipped into a flux material according to the present invention.
Figure 10:
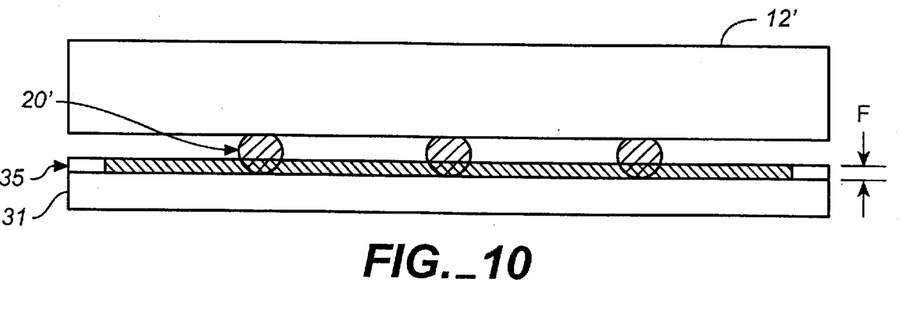
FIG. 10 is a cross-sectional side view of the alternative embodiment of FIG. 9, the integrated circuit chip with solder bumps being dipped in the flux material.
Figure 11:
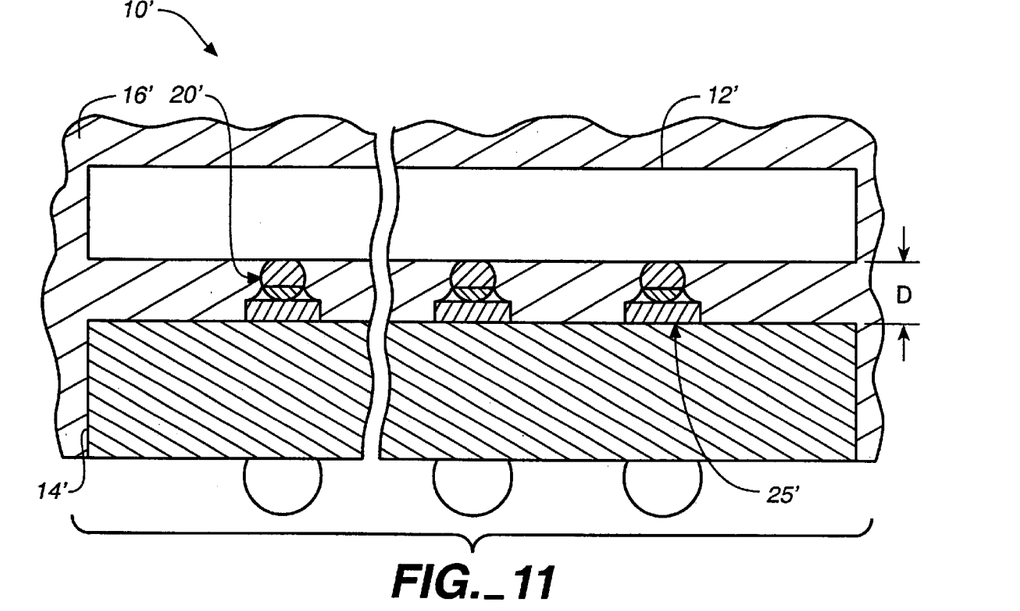
FIG. 11 is an enlarged cross-sectional side view of an alternative embodiment of the present invention showing a portion of the integrated circuit chip after the reflow process.

An alternative embodiment to control distance D or the gap between the circuit chip 12 and the substrate 14 is shown in FIGS. 9–11. FIG. 9 shows an integrated circuit chip 12' with solder bumps 20' before the solder bumps 20' are lowered into a base 31 that has a recess 33. The depth F of the recess is approximately one half of the height of the solder bump 20' or 0.0025 inches (0.064 mm) to 0.003 inches (0.076 mm). The recess 33 is filled with flux material 35 by a squeegee or other method that compacts the flux material 35 evenly into the recess 33. After the recess 33 is filled with the flux material 35, the solder bumps 20' are placed into the full depth of the recess 33 so that the lower portion of each solder bump is substantially evenly coated with flux material 35. FIG. 11 illustrates the package 10' after the integrated circuit chip 12' has been bonded to the substrate 14' and after the underfill 16' has been molded into the package 10' by the underfilling method according to the present invention.

With reference to FIGS. 12–15, the method of underfilling according to the present invention employs a mold 30 having a top half 32 and bottom half 34. The bottom half 34 of the mold is provided with cavities 36 for receiving the substrate solder bumps 24 on the lower side of the substrate. Alternatively, the mold cavities 36 may be eliminated and the substrate solder bumps 24 or pins may be attached after underfilling.

The bottom half 34 of the mold also includes a mold material overflow channel 38 which is positioned to receive mold material which passes through the central vent hole 26 in the substrate. Mold material which collects in the overflow channel 38 forms an overflow bead 48 of mold material on an underside of the substrate 14 as shown in FIGS. 7, 13, and 14.

Figure 12:
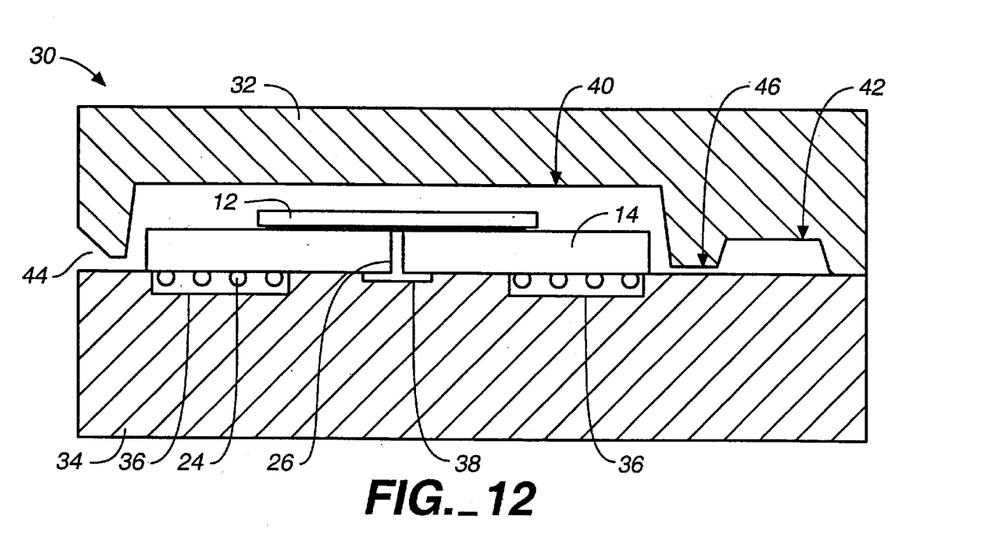
FIG. 12 is a cross-sectional side view of an integrated circuit chip and substrate placed within a mold cavity according to the present invention.

The top half 32 of the mold defines an upper half of a mold cavity 40 and an upper half of an overflow cavity 42. Between the top and bottom halves of the mold 30, a mold compound inlet 44 is provided through which the mold material is introduced into the mold cavity 40. In addition, a vent 46 connects the mold cavity 40 to the overflow cavity 42.

The molding process of the present invention is a transfer molding process with an operating temperature between approximately 150° C. and 180° C. and material pressures of approximately 300–1000 psi (0.144–0.479 bars). The transfer molding composition used in the present invention, once cured, does not become flowable upon reheating.

Figure 13:
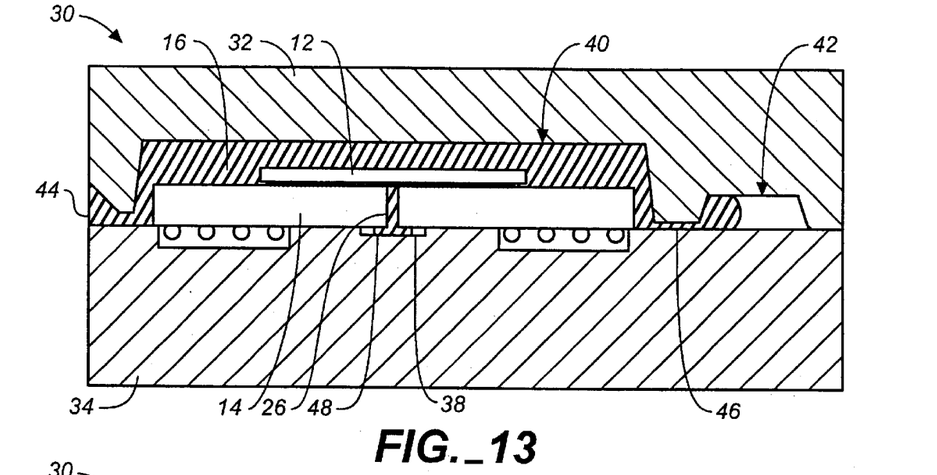
FIG. 13 is a cross-sectional side view of the mold of FIG. 12 during underfilling.
Figure 14:
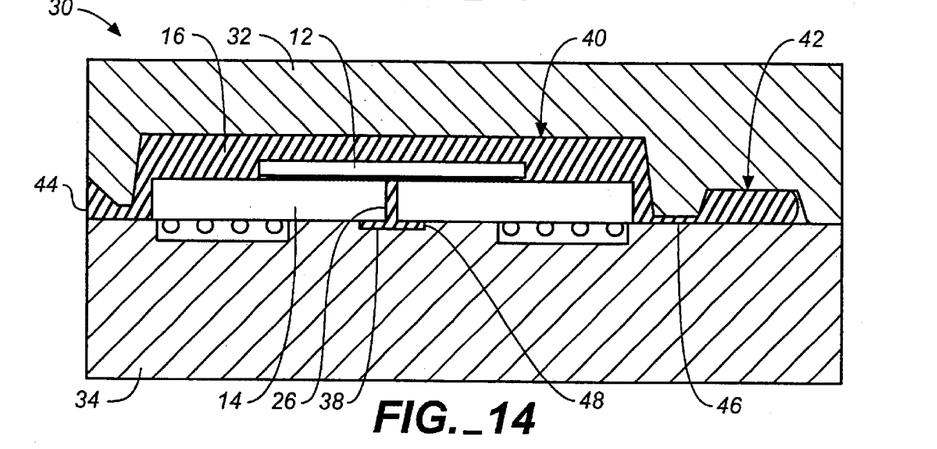
FIG. 14 is a cross-sectional side view of the mold of FIG. 12 when underfilling has been completed.

When the mold material is injected into the mold cavity 40 through the inlet 44 as shown in FIG. 13, the mold compound fills the mold cavity surrounding the integrated circuit chip 12 and the sides of the substrate 14. The mold compound is also forced between the chip 12 and the substrate 14 and into the air gaps which are present between the solder joints formed by the solder bumps 20. Therefore, the mold compound encapsulates all six sides of the 12 chip.

A pressure within the mold cavity 40 must be controlled while the underfilling process is performed to prevent the pressure within the mold cavity from exceeding a predetermined pressure threshold and pressing the chip 12 down onto the substrate with a force causing crushing of the solder bumps 20 before the underfilling process is complete. The mold cavity pressure is controlled by the mold vent 46 which allows some of the mold compound to escape from the mold cavity 40 into the overflow cavity 42. The size and shape of the mold vent 46 is particularly designed so that a predetermined threshold pressure within the mold cavity at which the solder bumps 20 would be crushed is not reached. The overflow cavity 42 accommodates a sufficient amount of mold compound to provide pressure control during the underfilling process. Once underfilling has been completed, and the solder bumps 20 and the standoffs 29 are completely surrounded by the mold compound, there is no longer a risk of excessive pressure in the mold cavity 40 causing the solder bumps to be crushed.

During the underfilling process, the mold compound moves radially inwardly from each of the edges of the integrated circuit chip 12 until it reaches the vent hole 26 in the substrate. The mold compound then passes through the vent hole 26 into the overflow channel 38 in the bottom half of the mold 34 and extends along a portion of the lower surface 28, or a second side, of the substrate forming the overflow bead 48. The volume of mold compound which can be held in both the vent hole 26 and the overflow channel 38 is designed to allow mold material to continue to pass into the vent hole of the substrate 14 until all the air spaces between the integrated circuit chip 12 and substrate have been completely filled. The total transfer time for the mold cavity 40 to be filled and for underfilling to be completed is preferably between approximately 15 and 20 seconds. The cure time for the thermoset mold material to cure is then between about 60 and 200 seconds. After this cure time, the mold is opened and the integrated circuit chip package 10 is removed from the mold. The total cycle time for underfilling and encapsulation of the integrated circuit chip 12 in the present invention is significantly better than the time for underfilling alone with the known underfilling methods employing capillary action.

An apparatus for delivery of the mold compound to the mold inlet 44 may be any of the known delivery systems including those employing a plunger to press a mold compound in pellet form into the mold tool. Alternatively, a multiple plunger system may be used to control the pressure of the mold compound being pressed into each mold cavity when a plurality of cavities are being filled. The multiple plunger system may be used either with or without the use of an overflow cavity 42 for additional pressure regulation.

Figure 15:
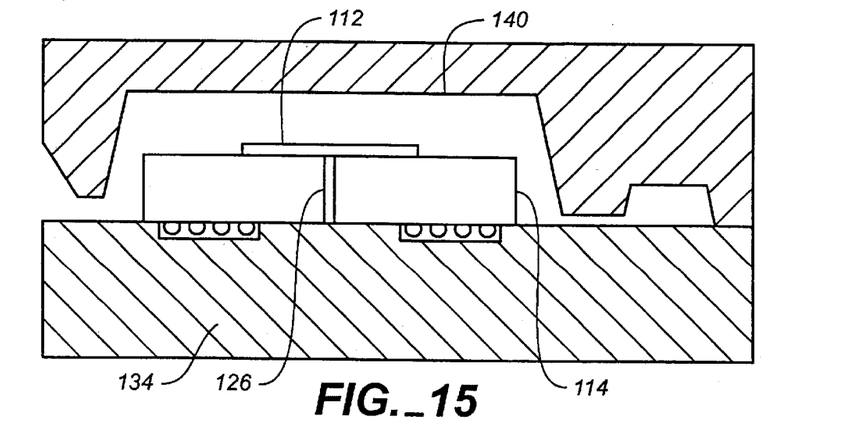
FIG. 15 is a cross-sectional side view of an additional embodiment of the mold without an overflow channel.

As illustrated in FIG. 15, in an alternative embodiment, the mold cavity 140 is substantially similar to the mold cavity of FIG. 12, except that the bottom half of the mold 134 does not include an overflow channel. During the underfilling process, the mold compound moves radially inwardly from each of the edges of the integrated circuit chip 112 until it reaches the vent hole 126 in the substrate 114. The mold compound then passes into the vent hole 126 while continuing to fill the air spaces between the integrated circuit chip 112 and the substrate 114. The vent hole 126 is designed so that the mold material can continue to pass into the vent hole and fill all the air spaces between the integrated circuit chip 112 in a substantially even or uniform manner. Accordingly, the vent hole 126 provides a means for air to escape from between the integrated circuit chip 112 and the substrate 114 during the underfilling process, as well as a means for holding the mold compound while it fills the air spaces between the integrated circuit chip in a substantially even or uniform manner. The vent hole 126 may be any suitable shape including, but not limited to, circular, rectangular, hexagonal, or the like.

Figure 16:
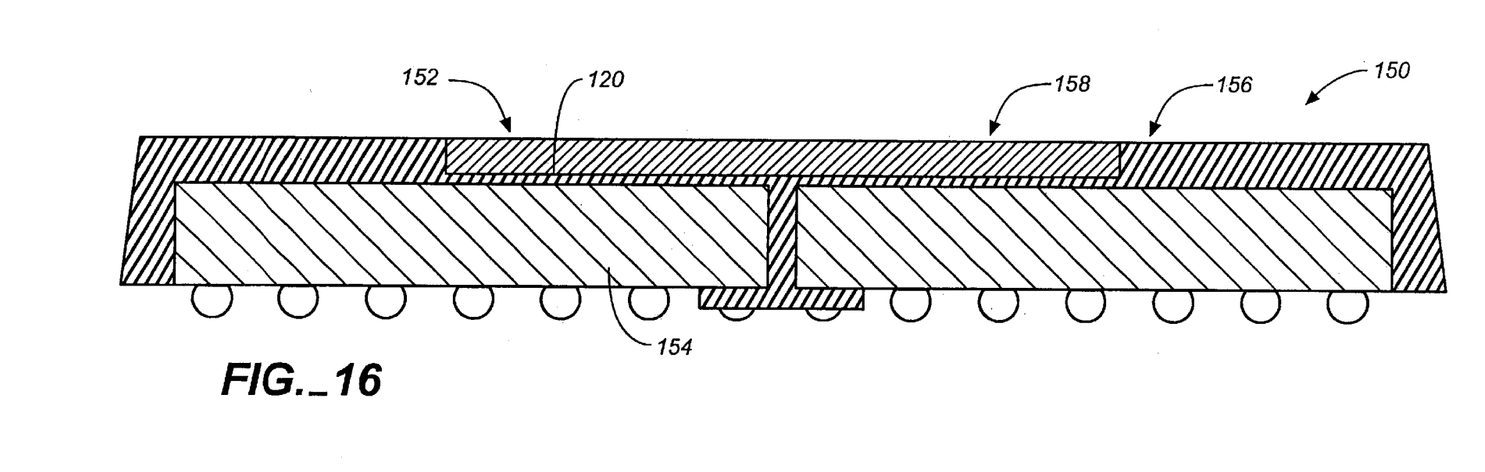
FIG. 16 is a cross-sectional side view of an alternative embodiment of an integrated circuit chip package.

According to another variation of the present invention, an integrated circuit chip package 150 as shown in FIG. 16 is formed in which the integrated circuit chip 152 is mounted on a substrate 154 and is not fully encapsulated by a mold compound 156. According to this aspect of the invention, the integrated chip package 150 is formed in a mold cavity having an upper mold half which engages a surface 158 of the integrated circuit chip 152. In this manner, the mold compound 156 surrounds the edges of the integrated circuit chip 152 and the edges of the substrate 154, but does not enclose the chip within the mold compound 156.

The integrated circuit chip package 150 shown in FIG. 16 is formed in the same manner as that of FIG. 7 by reflow soldering the integrated circuit chip 152 to the substrate 154 by a plurality of solder bumps 120. The integrated circuit chip 152 and substrate 154 are then placed into a mold cavity and a transfer molding compound 156 is injected into the mold cavity around the integrated circuit chip 152 and substrate 154 and forced into the space between the chip and the substrate to underfill all gaps between the solder bumps 120. The modified integrated circuit chip package 150 of FIG. 16 does not require that precautions be taken to prevent crushing solder bumps due to the fact that pressure is not applied by the mold compound to the exposed backside surface 158 of the chip 152.

FIG. 17 shows an alternative embodiment with multiple vent holes 26 in the substrate. It will be appreciated by those skilled in the art that any number of vent holes may be utilized to accommodate the overflow of the mold material.

The transfer molding process according to the present invention may be used for a wide variety of integrated circuit chip shapes, sizes, and types. The transfer molding composition may be modified as known to those in the art to achieve different transfer times, cure times, flow characteristics, and post cure properties.

The mold compound 16 for use in the present invention includes a combination of one or more adhesive and one or more filler material. It is also a compound that is forced by pressure to cause the composition to flow, in contrast to the prior art liquid material that flows from capillary action. The mold compound 16 may comprise other suitable materials to improve the properties of the chip package. For example, the mold compound 16 may contain silicone, to improve stress relief; wax, to enhance mold release; or scavengers, to reduce the detrimental electrical effect that ionic impurities in the mold compound may cause.

The filler material is a transfer molding composition that is a solid at room temperature prior to curing. The filler material is between about 60 and 95 percent of the mold compound and preferably between 75 and 85 percent of the mold compound. The filler material may be silica, quartz, or any other known filler material having particle diameters which are preferably 0.35–2 mils (0.01–0.05 mm). The filler material particles may be formed in different shapes such as spherical, elongated, or irregularly shaped to achieve different flow characteristics. The adhesive material may be any known adhesive material, such as a novolac epoxy.

While the invention has been described in detail with reference to the preferred embodiments thereof, it will be apparent to one skilled in the art that various changes and modifications can be made, and equivalence employed without departing from the spirit and scope of the inventions.

What is claimed is:

1. An integrated circuit chip packaging comprising:
    an integrated circuit chip having an active surface with interconnection pads disposed thereon;
    a substrate having a first side with bonding pads substantially corresponding to the interconnection pads of the integrated circuit chip, a second side having a plurality of solder pads electrically interconnected with the bonding pads, and a vent hole extending from the first side to the second side of the substrate and positioned beneath the integrated circuit chip when the chip is mounted on the substrate;
    a plurality of solder bumps electrically connecting the interconnection pads of the integrated circuit chip with the bonding pads on the first side of the substrate;
    a standoff to control a distance between the integrated circuit chip and the substrate; and
    a molded underfill material molded around the integrated circuit chip, the molded underfill material surrounding the solder bumps between the integrated circuit chip and the substrate, and the molded underfill material extending into the vent hole in the substrate, wherein the molded underfill material overflows the vent hole and extends along a portion of the second side of the substrate.

2. An integrated circuit chip package comprising:
    an integrated circuit chip having an active surface with interconnection pads disposed thereon;
    a substrate having a first side with bonding pads substantially corresponding to the interconnection pads of the integrated circuit chip, a second side having a plurality of solder pads electrically interconnected with the bonding pads, and a vent hole extending from the first side to the second side of the substrate and positioned beneath the integrated circuit chip when the chip is mounted on the substrate;
    a plurality of solder bumps electrically connecting the interconnection pads of the integrated circuit chip with the bonding pads on the first side of the substrate;
    a standoff to control a distance between the integrated circuit chip and the substrate; and
    a moled underfill material molded around the integrated circuit chip, the molded underfill material surrounding the solder bumps between the integrated circuit chip and the substrate, and the molded underfill material extending into the vent hole in the substrate, wherein the molded underfill material is solid at room temperature before curing.

3. The integrated circuit chip package according to claim 2, wherein the molded underfill material covers a backside of the integrated circuit chip encapsulating the chip.

4. The integrated circuit chip package according to claim 2, wherein the molded underfill material is epoxy.

5. The integrated circuit chip package according to claim 2, wherein the vent hole is positioned in the substrate at substantially a center of an area occupied by the integrated circuit chip.

6. The integrated circuit chip package according to claim 2, wherein the molded underfill material includes epoxy and between about 60 and 95 percent filler material.

7. The integrated circuit chip package according to claim 2, wherein a distance between the integrated circuit chip and the substrate is approximately 0.001–0.006 inches.

8. The integrated circuit chip package of claim 2, further comprising:
    a plurality of standoffs located between the integrated circuit chip and the substrate, the plurality of standoffs to control the distance between the integrated circuit chip and the substrate.

9. The integrated circuit chip package of claim 8, wherein the integrated circuit chip has a substantially rectangular shape, and one of the plurality of standoffs supporting said integrated circuit chip is located at each corner.

10. An integrated circuit chip package comprising:
    an integrated circuit chip having an active surface with interconnection pads disposed thereon;
    a substrate having a first side with bonding pads substantially corresponding to the interconnection pads of the integrated circuit chip, a second side, and a vent hole, having a largest dimension of 0.020 inches, extending from the first side to the second side of the substrate and positioned beneath the integrated circuit chip when the chip is mounted on the substrate; and
    a transfer molding composition containing between about 60 and 95 percent filler material which is forced by pressure into an air gap between the integrated circuit chip and the substrate, wherein the transfer molding composition is a material which is solid at room temperature before curing, and the transfer molding composition extending into the vent hole in the substrate.

11. The integrated circuit chip package of claim 10, wherein the transfer molding composition provides an underfilling for the integrated circuit chip.

12. The integrated circuit chip package of claim 10, wherein as the transfer molding composition is forced into the air gap between the integrated circuit chip and the substrate, the vent hole provides means for air to escape from between the integrated circuit chip and the substrate.

13. The integrated circuit chip package of claim 10, wherein the transfer molding composition is forced into the air gap between the integrated circuit chip and the substrate, and the vent hole providing means for underfilling of all spaces between said integrated circuit chip and said substrate.

\* \* \* \* \*